(12) United States Patent
Mutoh et al.

(10) Patent No.: US 6,774,445 B2
(45) Date of Patent: Aug. 10, 2004

(54) ACTUATOR

(75) Inventors: Kiyotaka Mutoh, Tokyo (JP); Yuzuru Ueda, Tokyo (JP); Norihiro Asada, Saitama (JP)

(73) Assignee: The Nippon Signal Co., Ltd., Tokyo (JP)

( * ) Notice: Subject to any disclaimer, the term of this patent is extended or adjusted under 35 U.S.C. 154(b) by 0 days.

(21) Appl. No.: 10/159,753

(22) Filed: May 30, 2002

(65) Prior Publication Data

US 2002/0149072 A1 Oct. 17, 2002

Related U.S. Application Data

(63) Continuation of application No. PCT/JP01/09404, filed on Oct. 25, 2001.

(30) Foreign Application Priority Data

Oct. 25, 2000 (JP) ............................................ 2000-325611

(51) Int. Cl.$^7$ ............................................................. H01L 29/82
(52) U.S. Cl. ........................ 257/415; 257/417; 257/419; 257/420; 335/222; 335/223; 335/224; 335/226; 335/229; 310/36; 359/196; 359/198; 359/199; 359/212; 359/214; 359/223; 359/226; 359/225
(58) Field of Search ................................. 257/415, 417, 257/419, 420; 335/222, 223, 226, 224, 229; 310/36; 359/196, 198, 199, 212, 214, 223, 224, 225

(56) References Cited

U.S. PATENT DOCUMENTS

| | | | | |
|---|---|---|---|---|
| 5,208,880 A | * | 5/1993 | Riza et al. ..................... | 385/18 |
| 5,912,608 A | * | 6/1999 | Asada ........................ | 335/222 |
| 5,966,009 A | * | 10/1999 | Asada ........................ | 324/97 |
| 6,122,089 A | * | 9/2000 | Minamoto et al. .......... | 359/198 |
| 6,404,313 B2 | * | 6/2002 | Asada ........................ | 335/222 |

FOREIGN PATENT DOCUMENTS

| | | |
|---|---|---|
| JP | 59-079824 | 5/1984 |
| JP | 64-30530 | 2/1989 |
| JP | 03-008313 | 1/1991 |
| JP | 03-069112 | 7/1991 |
| JP | 07-175005 | 7/1995 |
| JP | 07-218857 | 8/1995 |
| JP | 08-160281 | 6/1996 |
| JP | 2000-187140 | 7/2000 |
| JP | 2000-235152 | 8/2000 |

* cited by examiner

*Primary Examiner*—Nathan J. Flynn
*Assistant Examiner*—Fazli Erdem
(74) *Attorney, Agent, or Firm*—Lawrence E. Laubscher, Jr.

(57) ABSTRACT

The invention aims at suppressing an amount of deformation of a central portion of a movable part in a micro-miniature semiconductor actuator. A boundary portion is provided between a central portion and an edge of a movable part which is axially supported in a rotatable manner by torsion bars of an actuator, the boundary portion suppressing transmission of a warp due to an influence of air resistance at the edge of the movable part or moment of inertia, or heat generated by a driving force generating portion at the edge of the movable part, to a central portion of the movable part, to suppress deformation of the central portion of the movable part.

20 Claims, 4 Drawing Sheets

ACTUATOR

This application is a continuation of PCT/JP01/09404, filed on Oct. 25, 2001.

TECHNICAL FIELD

The present invention relates to an actuator that applies a driving force to a movable part axially supported on a torsion bar, to drive the movable part, and in particular to an actuator of a construction ideally suitable to an actuator equipped with a mirror portion for optical scanning.

BACKGROUND ART

Through the development of micro-electronics, represented by the high integration of semiconductor devices, many devices have undergone considerable miniaturization together with increases in functionality. In recent years, there have been utilized in laser optical scanning systems and the like, micro-miniature semiconductor actuators using semiconductor manufacturing technology.

Conventionally, these types of micro-miniature semiconductor actuators have been produced in the manner described below.

Using semiconductor manufacturing processes, a movable part equipped with a mirror for scanning light on the surface of a semiconductor substrate, and a beam portion axially supporting the movable part, are integrally formed on a silicon substrate. This silicon substrate with the movable part and the beam portion is then arranged on a glass substrate. At this time, the arrangement is made such that the center of the movable part is in contact with a projection on the glass substrate, and due to an indentation in the glass substrate, a fixed gap exists between the movable part and the glass substrate. Furthermore, a pair of electrodes for rotating and driving the movable part is provided on either side of the glass substrate projection.

In a semiconductor actuator of such a structure, by applying an external voltage between one of the electrodes and the movable part, an electrostatic attraction acts on the movable part, thus tilting the movable part. By applying a voltage alternately to each of the pair of electrodes, the movable part is driven to swing, so that reflected light from the mirror on the surface of the movable part is scanned.

However in the conventional semiconductor actuators of this type, since the movable part is extremely thin, when driving the movable part, the edge of the movable part is warped in the opposite direction to the rotation direction or the same direction of the rotation direction, due to air resistance, moment of inertia and the driving force acting on the edge of the movable part. Furthermore, in the conventional semiconductor actuator, since the movable part is a planar rectangular shape simply cut out of a silicon substrate, the affect of the warped edge is transmitted to the central portion of the movable part, causing a warp also in the central portion. As a result, in the case in which the mirror is positioned in the central portion of the movable part, the mirror is warped, interfering with the scanning of the reflected light from the mirror surface.

Moreover, in a semiconductor actuator of a structure in which a drive coil for generating a magnetic field by the electric current supply is provided on the movable part, and a static magnetic field acts on the drive coil to thereby generate a Lorentz force for driving the movable part, heat is generated in the drive coil as a result of the electric current supply. Therefore, in addition to the warp described above, the movable part is warped due to a bimetal action caused by a difference in the coefficient of thermal expansion of the mirror material and that of the substrate material. Furthermore, for the purpose of protecting and insulating the drive coil, the drive coil is covered with a protective film of polyimide or the like, but this protective coat also causes a warp of the movable part due to residual compressive stress within the protective coat.

In this manner, conventional semiconductor actuators are prone to deformation problems of the central portion of the movable part resulting from the influence of air resistance, moment of inertia, heat and residual compressive stress. In particular, when a mirror is provided on this central portion of the movable part, the warp results in interference with the optical scanning function.

The present invention addresses the problems outlined above, with an object of providing an actuator of a construction capable of suppressing deformation of the central portion of the movable part.

DISCLOSURE OF INVENTION

To achieve the above object, the present invention provides an actuator comprising a movable part and a torsion bar for axially supporting the movable part in a rotatable manner, the movable part being applied with a driving force to be driven, wherein a boundary portion for suppressing causes of deformation of a central portion of the movable part, which are transmitted from an edge of the movable part to the central portion of the movable part, is provided between the central portion of the movable part and at least an edge of the movable part parallel with the torsion bar.

With such a construction, by essentially separating the edge of the movable part and the central portion of the movable part with the boundary portion, causes of deformation from the edge of the movable part are less likely to be transmitted to the central portion of the movable part.

According to a second aspect of the invention, the construction may be such that the movable part is provided with a mirror portion on the central portion thereof and a driving force generating portion on the edge thereof. Then, by substantially separating the driving force generating portion on the edge of the movable part from the mirror portion on the central portion of the movable part with the boundary portion, it is difficult for causes of deformation from the driving force generating portion on the edge of the movable part, to be transmitted to the mirror portion of the movable part central portion, and hence deformation of the mirror portion can be suppressed.

According to a third aspect of the invention, the construction may be such that the mirror portion and the driving force generating portion are provided on the same face of the movable part. Or, according to a fourth aspect of the invention, the construction may be such that the driving force generating portions are provided on both front and rear faces of the movable part. If the driving force generating portions are provided on both the front and rear faces of the movable part, then compared with the case where the driving force generating portion is provided on only one of the front or rear faces of the movable part, the rotation angle of the movable part can be increased in case of the same electric current supply amount, and further the electric current supply amount can be reduced in case of the same rotation angle.

According to a fifth aspect of the invention, the driving force generating portion may be a coil portion provided on the periphery of the movable part for generating a magnetic field by the electric current supply, the construction being such that a static magnetic field acts on the coil portion on the edge of the movable part to generate the driving force and drive the movable part. Moreover, according to a sixth aspect of the invention, the driving force generating portion may be a thin film magnet provided on the periphery of the movable part, the construction being such that an electromagnetic attraction acts on the thin film magnet to drive the movable part.

The boundary portion may be a through hole according to a seventh aspect of the invention. In this situation, according to an eighth aspect of the invention, the through hole may be provided around the whole periphery of the central portion or mirror portion, while remaining a part of the movable part between the edge of the movable part and the central portion of the movable part. Then, the region of the through hole for suppressing transmission of causes of deformation from the edge of the movable part to the central portion can be extended. Furthermore, the driving force is transmitted to the movable part central portion via the remaining movable part between the edge of the movable part and the movable part central portion so as to be able to rotate the movable part. Also, according to a ninth aspect of the invention, the construction may be such that a filler which can suppress the causes of deformation and which is made of a material different to a material of the movable part is filled into the through hole.

According to a tenth aspect of the invention, the boundary portion may be a groove. In this case, the groove may be formed in either one of the front and rear faces of the movable part according to an eleventh aspect of the invention, or this may be formed in both the front and rear faces according to a twelfth aspect of the invention. Moreover, according to a thirteenth aspect of the invention, the groove may be formed around the whole periphery of the central portion or the mirror portion. Further, according to a fourteenth aspect of the invention, the construction may be such that the groove is filled with a filler which can suppress the causes of deformation and which is made of a material different to a material of the movable part.

According to a fifteenth aspect of the invention, the boundary portion may be formed from a filler which can suppress the causes of deformation and which is made from a material different to a material of the movable part. In this case, according to a sixteenth aspect of the invention, the filler may be provided around the whole periphery of the central portion or the mirror portion.

Moreover, the present invention provides an actuator comprising a movable part and a torsion bar for axially supporting the movable part in a rotatable manner, the movable part provided with a mirror portion for reflecting a light beam and a driving force generating portion that applies a driving force on the movable part, so that the movable part is driven by the driving force, wherein a boundary portion for suppressing causes of deformation of the mirror portion, which are transmitted from the driving force generating portion to the mirror portion, is provided between the mirror portion and driving force generating portion of the movable part.

With such a construction, the boundary portion substantially separates between the mirror portion and the driving force generating portion, thus the causes of deformation from the driving force generating portion are less likely to be transmitted to the mirror portion.

BEST MODE FOR CARRYING OUT THE INVENTION

Hereunder is a description of embodiments of an actuator according to the present invention, with reference to the appended drawings. In the various embodiments hereunder, explanation is given of examples where the present invention is applied to a planar type galvano-mirror, being a semiconductor actuator which utilizes semiconductor manufacturing techniques, as proposed by the present applicant (refer to Japanese Unexamined Patent Publication Nos. 7-175005 and 7-218857).

Figure 1:
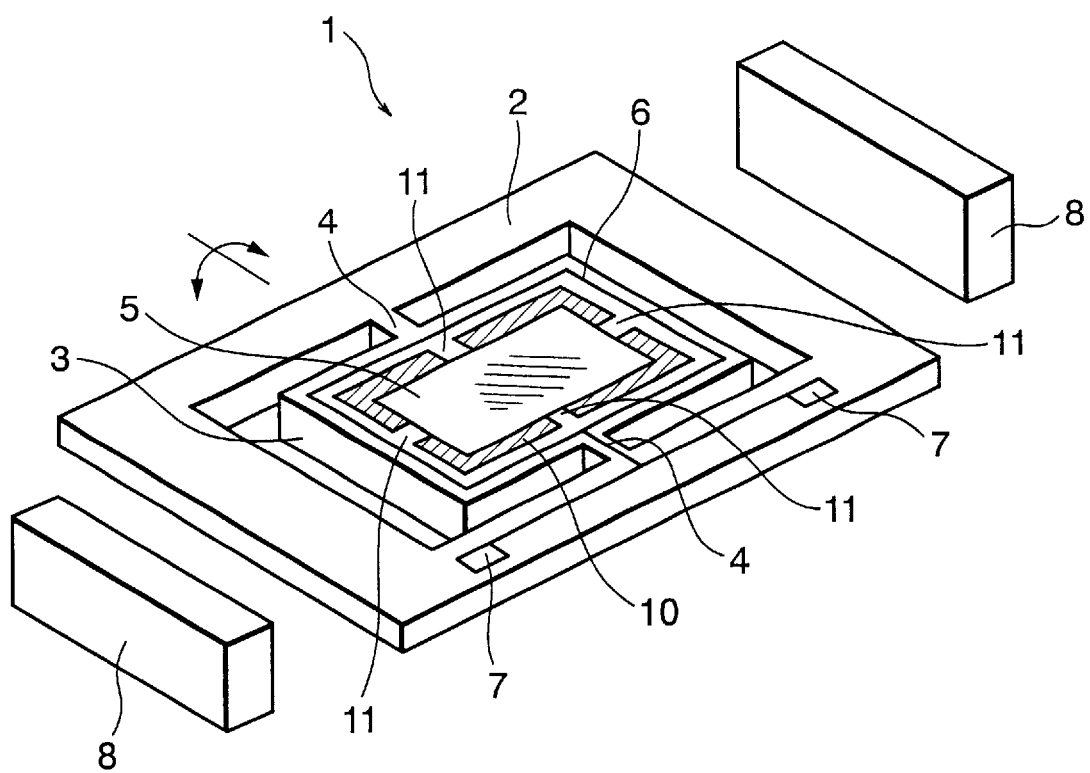
FIG. 1 is a schematic diagram showing an embodiment of an actuator according to the present invention.

FIG. 1 is a schematic diagram of a first embodiment of an actuator according to the present invention.

In FIG. 1, a planar type galvano-mirror 1 as an actuator of this embodiment comprises a planar movable part 3 and torsion bars 4 which are integrally formed on a silicon substrate 2. The torsion bars 4 axially support the movable part 3, so as to be able to swing the movable part 3 in the direction of the arrows in the figure relative to the silicon substrate 2 at a central location of the movable part 3. On the front surface central portion of the movable part 3 there is provided a mirror 5 for reflecting light, formed for example from a thin film of aluminum, gold or the like. On the front surface periphery of movable part 3 is wound for example a thin copper film coil 6 (for simplification, this is shown by a simple line in the figure), which constitutes the driving force generating portion for generating a magnetic field by the electric current supply, so as to surround the mirror 5. The ends of the coil 6 are respectively connected to a pair of electrical terminals 7, 7 provided on a fixed portion of the silicon substrate 2. While not shown in the figure, the coil 6 is covered with a protective coat formed from polyimide for the purpose of protecting and insulating the coil. In this embodiment, the construction is such that the coil 6 is provided on the same side as the mirror 5 of the movable part 3, however this may be provided on the rear surface opposite to the mirror 5, or the coil 6 may be provided on both the front and rear surfaces of movable part 3. In the case where the coil 6 is formed on both the front and rear surfaces of movable part 3, the rotation angle of the movable part 3 can be increased.

Furthermore, a pair of permanent magnets 8 for generating a static magnetic field are fixedly arranged so that the static magnetic field acts on the opposite side coil portions parallel with the axial direction of the torsion bars 4 of the movable part 3.

Moreover, a boundary portion 10 shown by the shaded portion in the figure, being the feature of the present invention, is provided on the silicon substrate portion between the mirror 5 and the coil 6 of the movable part 3. The boundary portion 10 is for suppressing the causes of deformation of the central portion of the movable part provided with the mirror 5, which are transmitted to the central portion of the movable part from the edge of the movable part parallel with the axial direction of the torsion bars 4.

Figure 2:
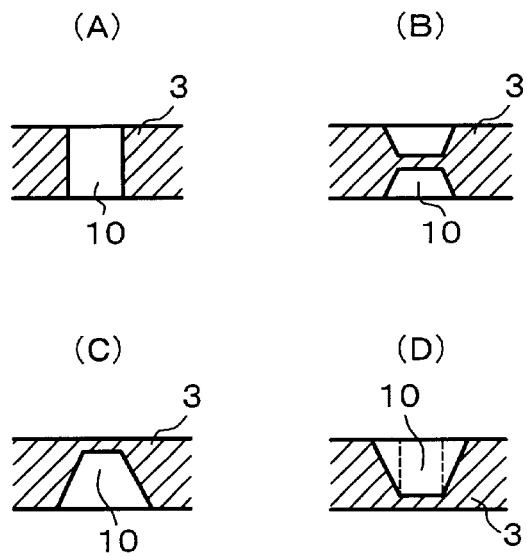
FIG. 2 shows cross-sectional diagrams showing various structural examples of boundary portions.
Figure 3:
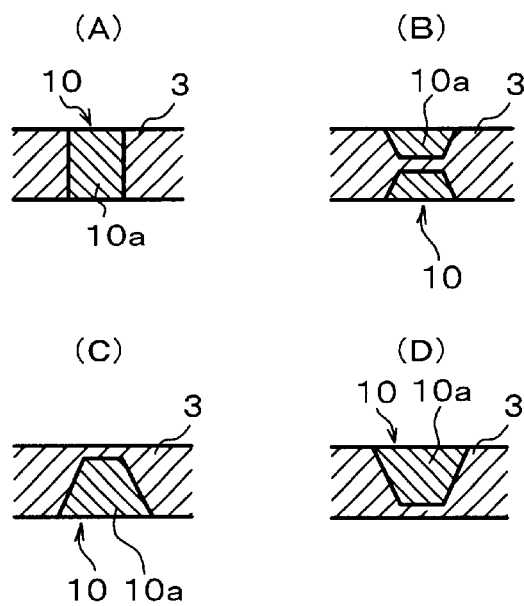
FIG. 3 shows cross-sectional diagrams showing various structural examples of boundary portions filled with filler.

The construction of the boundary portion 10 may be a through hole such as shown in (A) of FIG. 2 or a groove shape such as shown in (B) of FIG. 2 to (D) of FIG. 2. In the case of a groove shape, the groove may be formed in both the front and rear faces of the movable part 3 as shown in (B) of FIG. 2, or the groove may be formed in either one of the front and rear faces of the movable part 3 as shown in (C) and (D) of FIG. 2. The cross-sectional shape of the groove may also, for example as shown by broken lines in (D) of FIG. 2, have a vertical side wall face. Furthermore, as shown in (A) to (D) of FIG. 3, the through hole or the groove may be filled with a filler 10a such as a polyimide having thermal insulation properties, made of a material different to that of the silicon substrate 2.

In the case where the boundary portion 10 is the through hole, then as shown in FIG. 1, it is necessary to provide beams 11 connecting the central portion side of the movable part provided with the mirror 5 and the periphery of the movable part provided with the coil 6, so that the driving force for the movable part from the periphery of the movable part is transmitted to the central portion of the movable part, to rotate the periphery and the central portion as one. However, if as shown in FIG. 1, the beams 11 are provided at the edge of the movable part parallel with the axial direction of the torsion bars 4, where the pair of permanent magnets 8 are arranged, then it is not necessary to provide the beams 11 of the edges of the movable part perpendicular to the axial direction of the torsion bars 4. For the causes of deformation, there can be considered, for example, a warp due to air resistance when the movable part 3 swings, a warp due to moment of inertia, heat transfer from coil heat at the time of electric current supply or a warp due to the bimetallic effect resulting from differences in coefficient of thermal expansion of the various layers of for example the mirror 5, the silicon substrate 2, and the protective coat (not shown in the figure) and the like constituting the movable part 3.

Furthermore, the boundary portion 10 may be constructed such that the filler 10a, such as the beforementioned polyimide having thermal insulation properties, made of a material different to that of the silicon substrate 2, is filled around the whole boundary perimeter of the mirror forming region and the coil forming region of the movable part 3, so that the two regions are substantially separated.

Here, the principal of operation of the planar type galvano-mirror 1 of the present embodiment will be briefly described.

A static magnetic field is formed by means of the permanent magnets 8, 8 on opposite sides of the movable part 3, in a direction so as to intersect the coil 6 lying along the planar face of the movable part 3. When a current flows in the coil 6 positioned in this static magnetic field, a magnetic force represented by the following equation (1), acts in a direction according to Flemming's left hand rule related to current, magnetic flux density and force, on the opposite sides of the movable part 3 in proportion to the current density and the magnetic flux density of the coil 6, so that the movable part 3 is rotated;

$$F = i \times B \quad (1)$$

where F is the magnetic force, i is the current flowing through in the coil, and B is the magnetic flux density.

On the other hand, when the movable part 3 is rotated, the torsion bars 4 are twisted, producing a spring reaction force, so that the movable part 3 is rotated to a position where the magnetic force F and the spring reaction force are in equilibrium. Since the rotation angle of the movable part 3 is proportional to the current i flowing in the coil 6, by controlling the current i flowing in the coil 6, the rotation angle of the movable part 3 can be controlled. Consequently, the reflection direction of a laser beam incident on the mirror 5 in a plane perpendicular to the axis of the torsion bars 4 can be freely scanned. Hence, scanning of the laser beam is possible by cyclical operation to continuously change the displacement angle of the mirror 5.

In the planar type galvano-mirror 1 which operates in this manner, there is provided, between the movable part central portion and the movable part edge, the boundary portion 10 for suppressing transmission of warp of the edge of the movable part, or of heat, to the movable part central portion, which is the cause of deformation of the movable part central portion. Therefore, due to the presence of the boundary portion 10, it is difficult for the warp of the movable part edge due to air resistance or moment of inertia or the like at the time of operating the galvano-mirror 1, to be transmitted to the movable part central portion. Furthermore, due to the presence of the boundary portion 10, it is difficult for the heat produced by the coil 6 at the periphery of the movable part 3 due to the electric current supply to be transmitted to the movable part central portion. In the case where the boundary portion 10 is formed by the through hole or groove, the weight itself of the movable part 3 is reduced and the moment of inertia force is reduced, so that the warp of the moveable part edges can be even further reduced. In the case where the boundary portion 10 is the through hole, then at the time of rotation of the movable part 3, air passes through the boundary portion 10 to escape so that the air resistance is reduced. Hence, the warp of the movable part edges can be further reduced. Moreover, an influence of residual stress of the coil protective coat on the movable part central portion can be suppressed due to the presence of the boundary portion 10. Hence, a warp of the movable part central portion itself can be suppressed.

In the above manner, according to the galvano-mirror 1 of this embodiment, since the boundary portion 10 formed for example by a through hole, a groove, a filler material or the like is provided between the central portion and the edge of the movable part, a warp of the mirror 5 on the movable part central portion due to an influence from the movable part edge can be suppressed. Hence, optical scanning accuracy of the planar type galvano-mirror 1 can be increased.

The shape of the boundary portion 10 is not limited to the shape of FIG. 1, and may be any shape which can suppress the cause of deformation of the movable part central portion, such as warp, heat or residual stress transmitted from the movable part edge to the movable part central portion, and various shapes can be considered.

Figure 4:
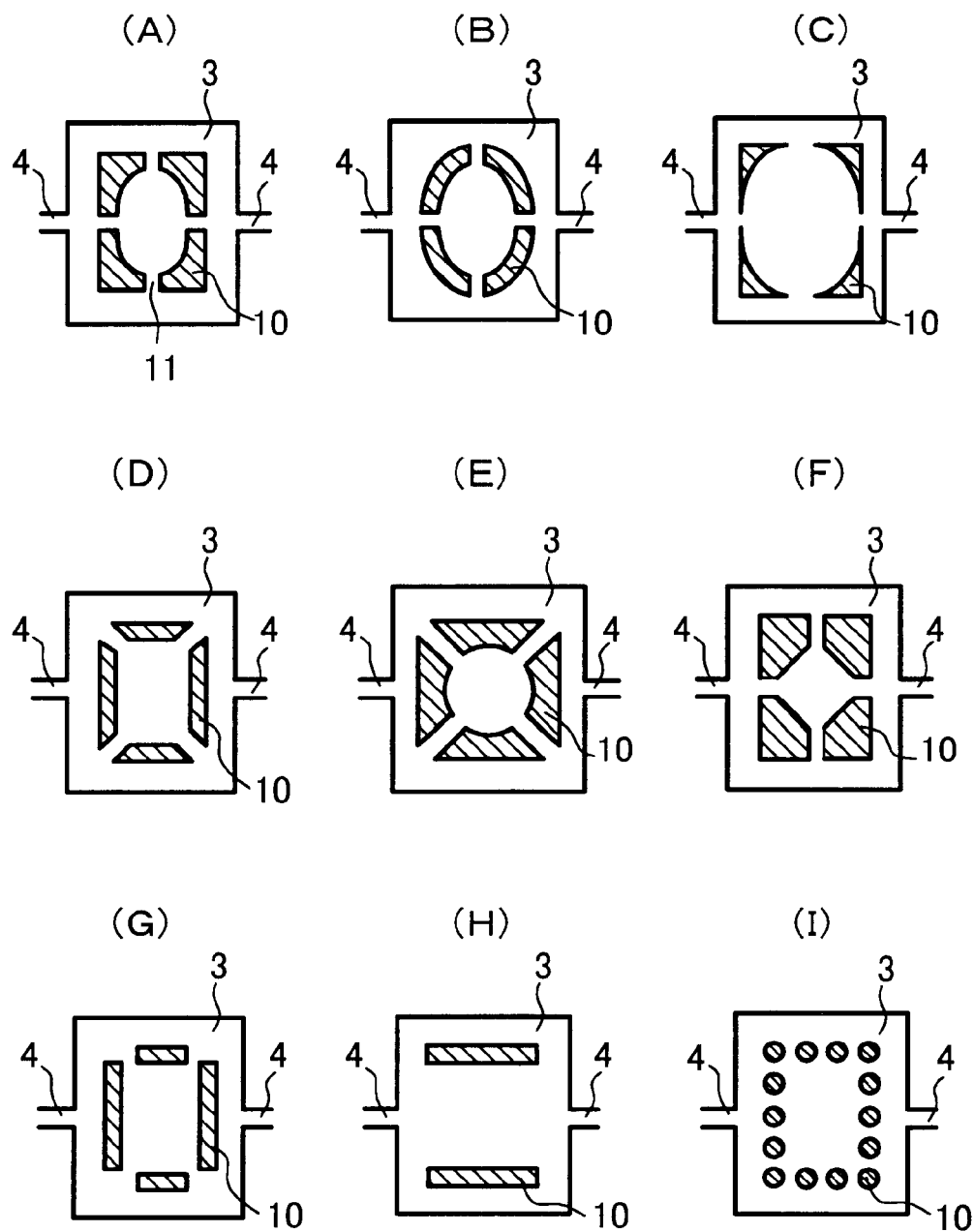
FIG. 4 shows plan views showing examples of various shapes for the boundary portions.
Figure 5:
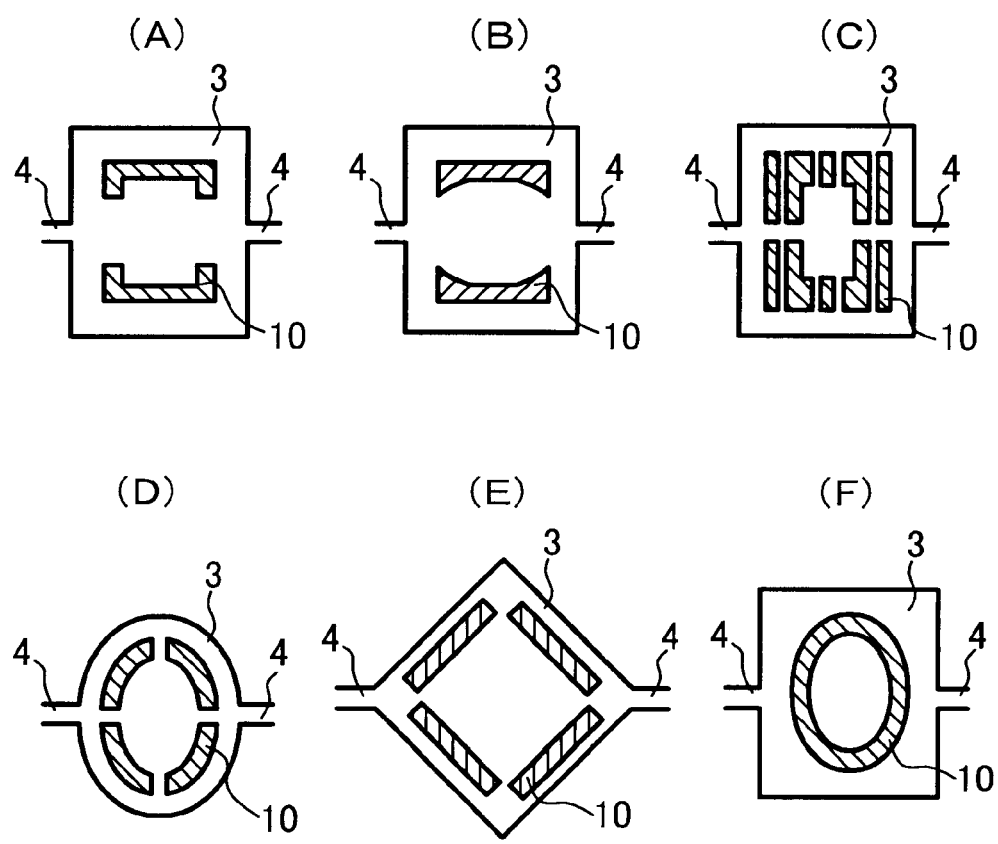
FIG. 5 shows plan views showing examples of various shapes for the boundary portions different to those in FIG. 4.

FIG. 4 and FIG. 5 show examples of various shapes for the boundary portion 10. Components the same as those of the embodiment of FIG. 1 are denoted by the same reference numerals. The mirror 5 provided in the central portion of the movable part 3 is omitted from the figures.

In FIG. 4 and FIG. 5, the shaded portion is the boundary portion 10. If the boundary portion 10 is formed to be one of the shapes of (A) to (C), (E) of FIG. 4 and (D), (F) of FIG. 5, then the mirror to be provided in the central portion of the movable part 3 may be formed in a circular shape or an oval shape. If the boundary portion 10 is formed to be one of the shapes of (F) of FIG. 4 and (E) of FIG. 5, then the mirror to be provided in the central portion of the movable part 3 may be formed in a rhombic shape. If the boundary portion 10 is formed to be the shape of the embodiment of FIG. 1, or one of the shapes of (D), (G) to (I) of FIG. 4, and (A) to (C) of FIG. 5, then the mirror to be provided in the central portion of the movable part 3 may be a square or rectangular shape. The shapes of the boundary portions shown in FIG. 4 and FIG. 5 other than the shape of (F) of FIG. 5 may be applied to any of the constructions where a through hole or groove is formed or where a filler material 10a having heat insulation properties is filled into the through hole or groove. In the case where the boundary portion 10 is the through hole, since the drive force is transmitted from the edge to the central portion of the movable part 3, then a connection portion such as the beam 11 which connects the edge and the central portion of the movable part 3 is necessary. In the case where the boundary portion 10 is the groove or filler material 10a, then the connecting portion is not necessarily required, and for example as shown in (F) of FIG. 5, the boundary portion 10 may be provided continuously along the whole periphery of the movable part 3. The shape of the continuous boundary portion 10 is obviously not limited to that of (F) of FIG. 5.

When the boundary portion 10 is provided between the central portion and the edge of the movable part 3, in addition to the affect that the warp of the central portion can be suppressed, in the case where a mirror is provided on the central portion of the movable part 3, there is the advantage, as is clear from FIG. 4 and FIG. 5, that the mirror shape can be formed in a free shape such as a circle, an oval, a rhombic shape or a star shape.

In the above described embodiments, the examples are shown for where the boundary portion 10 is provided on the actuator constructed with the coil 6 wound on the periphery of the movable part 3 to obtain the driving force of the movable part 3 due to Lorentz forces. However, needless to say, as also shown in the above mentioned Japanese Unexamined Patent Publication No. 7-175005, the present invention may also be applied to an actuator where a thin film magnet is provided on the periphery of the movable part 3, and the coil is wound on the site parallel with the axial direction of the torsion bars 4 on the fixed silicon substrate 2, and the movable part 3 is rotated utilizing, as a driving force, the electrostatic attraction generated by the electric current supply. Moreover, the present invention may be applied to an actuator which utilizes the electrostatic attraction as the driving force of the movable part. Furthermore, application of the present invention is not necessarily limited to semiconductor actuators manufactured utilizing semiconductor manufacturing technology, and may be applied to any actuator provided that this is of a construction where the movable part is axially supported by torsion bars and is driven using an electric or magnetic driving force such as a Lorentz force, electromagnetic attraction, or electrostatic attraction, or a mechanical driving force.

According to the present invention as described above, since the transmission of warp of the movable part edge to the movable part central portion can be suppressed by the presence of the boundary portion, the amount of deformation of the movable part central portion can be suppressed, and hence the central portion of the movable part can be maintained flat. Furthermore, in the case where a mirror portion is provided on the central portion of the movable part, transmission of warp of the driving force generating portion to the mirror portion can be suppressed by the presence of the boundary portion, and hence the amount of deformation of the mirror portion can be suppressed, and the mirror portion can be maintained flat. Consequently, directional accuracy of a scanning beam reflected on the mirror portion can be improved. If the boundary portion is formed by a through hole, air can flow through the through hole of the boundary portion at the time of rotation of the movable part so that air resistance can be reduced. Hence, the influence of warp transmitted from the edge of the movable part to the central portion of the movable part at the time of rotation can be reduced. Furthermore, if the boundary portion is formed by a through hole or groove, the weight of the movable part itself can be reduced, and hence the inertia force acting on the movable part edge can be reduced. Therefore, the influence of warp transmitted from the edge of the movable part to the central portion of the movable part can be further reduced.

Industrial Applicability

The present invention enables improvement in optical scanning accuracy and the like, of an optical scanning actuator applied for example to a laser beam scanning system. Hence, industrial applicability is significant.

What is claimed is:

1. An actuator comprising a movable part and a torsion bar for axially supporting said movable part in a rotatable manner about a single axis, said movable part being applied with a driving force to be driven,
wherein a boundary portion is provided between a central portion of said movable part and at least an edge of said movable part parallel with said torsion bar suppress causes of deformation of the central portion of said movable part which are transmitted from the edge to the central portion of said movable part.

2. An actuator according to claim 1, wherein said movable part is provided with a mirror portion on the central portion and a driving force generating portion on the edge thereof.

3. An actuator according to claim 2, wherein said mirror portion and said driving force generating portion are provided on the same face as said movable part.

4. An actuator according to claim 2, wherein said driving force generating portions are provided on both front and rear faces of said movable part.

5. An actuator according to claim 2, wherein said driving force generating portion is a coil portion provided on the periphery of said movable part for generating a magnetic field by the electric current supply, and a static magnetic field acts on the coil portion on the edge of said movable part to generate said driving force and drive said movable part.

6. An actuator according to claim 2, wherein said driving force generating portion is a thin film magnet provided on the periphery of said movable part, and an electromagnetic attraction acts on said thin film magnet to drive said movable part.

7. An actuator according to claim 1, wherein said boundary portion is a through hole.

8. An actuator according to claim 7, wherein said through hole is provided around the whole periphery of said central portion of said movable part, while a part of said movable part remains between the edge and the central portion of said movable part.

9. An actuator according to claim 7, wherein a filler which can suppress said causes of deformation and which is made of a material different from a material of said movable part is filled into said through hole.

10. An actuator according to claim 1, wherein said boundary portion is a groove.

11. An actuator according to claim 10, wherein said groove is formed in either one of the front and rear faces of said movable part.

12. An actuator according to claim 10, wherein said groove is formed in both the front and rear faces of said movable part.

13. An actuator according to claim 10, wherein said groove is provided around the whole periphery of said central portion.

14. An actuator according to claim 10, wherein said groove is filled with a filler which can suppress said causes of deformation and is made of a material different from a material of said movable part.

15. An actuator according to claim 1, wherein said boundary portion comprises a filler which can suppress said causes of deformation and is made of a material different from a material of said movable part.

16. An actuator according to claim 15, wherein said filler is provided around the whole periphery of said central portion.

17. An actuator comprising a movable part and a torsion bar for axially supporting said movable part in a rotatable manner about a single axis, said movable part provided with a mirror portion for reflecting a light beam and a driving force generating portion that applies a driving force on said movable part, so that said movable part is driven by said driving force, wherein a boundary portion for suppressing causes of deformation of said mirror portion, which are transmitted from said driving force generating portion to said mirror portion, is provided between said mirror portion and said driving force generating portion of said movable part.

18. An actuator according to claim 17, wherein said movable part is provided with said mirror portion on the central portion thereof and said driving force generating portion on the edge thereof.

19. An actuator according to claim 18, wherein said mirror portion and said driving force generating portion are provided on the same face as said movable part.

20. An actuator according to claim 18, wherein said driving force generating portion is a coil portion provided on the periphery of said movable part for generating a magnetic field by the electric current supply, and a static magnetic field acts on the coil portion on the edge of said movable part to generate said driving force and drive said movable part.

* * * * *